(12) United States Patent
Ichinose et al.

(10) Patent No.: US 10,953,487 B2
(45) Date of Patent: Mar. 23, 2021

(54) ULTRASONIC VIBRATION BONDING APPARATUS

(71) Applicant: Toshiba Mitsubishi-Electric Industrial Systems Corporation, Chuo-ku (JP)

(72) Inventors: Akihiro Ichinose, Tokyo (JP); Yoshihito Yamada, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 131 days.

(21) Appl. No.: 15/762,254

(22) PCT Filed: Sep. 29, 2015

(86) PCT No.: PCT/JP2015/077423
§ 371 (c)(1),
(2) Date: Mar. 22, 2018

(87) PCT Pub. No.: WO2017/056175
PCT Pub. Date: Apr. 6, 2017

(65) Prior Publication Data
US 2018/0272463 A1    Sep. 27, 2018

(51) Int. Cl.
*B23K 20/00* (2006.01)
*B23K 20/10* (2006.01)
(Continued)

(52) U.S. Cl.
CPC ............ *B23K 20/103* (2013.01); *B23K 20/10* (2013.01); *B23K 20/2333* (2013.01);
(Continued)

(58) Field of Classification Search
CPC ........ H01L 2224/78301; B23K 11/002; B23K 11/061; B23K 20/106; B23K 2103/04
See application file for complete search history.

(56) References Cited

U.S. PATENT DOCUMENTS 6,299,050 B1 * 10/2001 Okamura ............. B23K 20/123
156/73.5
2009/0218032 A1 * 9/2009 Shimizu ................. B29C 65/08
156/73.4
(Continued)

FOREIGN PATENT DOCUMENTS

JP    4-343240 A    11/1992
JP    11-163041 A    6/1999
(Continued)

OTHER PUBLICATIONS

Office Action dated Oct. 30, 2018 in Japanese Patent Application No. 2017-542546, with English translation, 7 pages.
(Continued)

*Primary Examiner* — Erin B Saad
(74) *Attorney, Agent, or Firm* — Xsensus LLP

(57) ABSTRACT

A bonding tool that executes an ultrasonic vibration processing of applying ultrasonic vibration to an application portion on a lead wire from a direct contact tip portion and a pair of press mechanisms having a pair of press rollers capable of performing a rotational operation. The pair of press mechanisms executes a press processing of pressing both sides of the application portion on the lead wire by the pair of press rollers at a time of execution of the ultrasonic vibration processing by the bonding tool and a movement processing of executing a rotational operation performed by the pair of press rollers to move the pair of press rollers on the lead wire while pressing the lead wire at a time of non-execution of the ultrasonic vibration processing.

2 Claims, 4 Drawing Sheets

(51) Int. Cl.
*H05K 3/32* (2006.01)
*H05K 3/10* (2006.01)
*B23K 20/26* (2006.01)
*B23K 20/233* (2006.01)
*B23K 20/24* (2006.01)
*B23K 103/00* (2006.01)
*B23K 101/42* (2006.01)
*H01L 21/607* (2006.01)
*B23K 103/10* (2006.01)
*B23K 103/18* (2006.01)
*B23K 103/08* (2006.01)
*H01B 13/012* (2006.01)
*H01L 23/00* (2006.01)

(52) U.S. Cl.
CPC .............. *B23K 20/24* (2013.01); *B23K 20/26* (2013.01); *H05K 3/103* (2013.01); *H05K 3/328* (2013.01); *B23K 2101/42* (2018.08); *B23K 2103/08* (2018.08); *B23K 2103/10* (2018.08); *B23K 2103/18* (2018.08); *B23K 2103/54* (2018.08); *H01B 13/01209* (2013.01); *H01L 24/78* (2013.01); *H01L 2021/607* (2013.01); *H01L 2224/7855* (2013.01); *H01L 2224/78353* (2013.01); *H01L 2224/78842* (2013.01); *H01L 2224/78901* (2013.01); *H01L 2224/78981* (2013.01); *H05K 2203/0285* (2013.01); *H05K 2203/049* (2013.01); *H05K 2203/0495* (2013.01)

(56) References Cited

U.S. PATENT DOCUMENTS

2011/0233173 A1* 9/2011 Kaneko ................ B23K 11/002
219/83
2013/0119115 A1* 5/2013 Kato .................... B23K 20/126
228/112.1

FOREIGN PATENT DOCUMENTS

JP     2011-9262 A    1/2011
JP     2011-96769 A    5/2011

OTHER PUBLICATIONS

International Search Report dated Dec. 22, 2015 in PCT/JP2015/077423 filed Sep. 29, 2015.
Combined Taiwanese Office Action and Search Report dated Jun. 15, 2017 in Patent Application No. 105103750 (with partial English language translation).
International Preliminary Report on Patentability and Written Opinion dated Apr. 12, 2018 in PCT/JP2015/077423 with English translation.
Office Action dated Sep. 3, 2019 in corresponding Korean Patent Application No. 10-2018-7007581 (with English Translation), 8 pages.
Chinese Office Action dated Jul. 1, 2020, issued in corresponding Chinese Patent Application No. 201580083461.2.

\* cited by examiner

ULTRASONIC VIBRATION BONDING APPARATUS

TECHNICAL FIELD

The present invention relates to a pressurized ultrasonic vibration bonding apparatus, and relates to, for example, an ultrasonic vibration bonding apparatus applied in a case where a lead wire having conductivity is bonded onto a thin substrate by ultrasonic vibration bonding.

BACKGROUND ART

A pressurized ultrasonic vibration bonding technique is conventionally adopted as a method of an intermediate joint bonding in a wire harness, for example. In the ultrasonic vibration bonding technique, a work is disposed on a predetermined member, and ultrasonic vibration is applied while pressing the work. The work is strongly bonded to the predetermined member by energy of the pressure and the ultrasonic vibration.

The pressurized ultrasonic vibration bonding technique is also adopted in a field of semiconductor at a time of mounting an electronic component, and Patent Document 1 discloses a pressurized ultrasonic vibration bonding apparatus as such a technique, for example.

PRIOR ART DOCUMENTS

Patent Documents

Patent Document 1: Japanese Patent Application Laid-Open No. 2011-9262

SUMMARY

Problem to be Solved by the Invention

FIG. 6 and FIG. 7 are explanation drawings for pointing out a problem of a conventional pressurized ultrasonic vibration bonding apparatus 200 disclosed in Patent Document 1. FIG. 6 is an enlarged view illustrating a state where press members 29 and 39 press a lead wire 12 in an ultrasonic vibration processing and FIG. 7 is an enlarged view illustrating a state after the ultrasonic vibration processing, both seen from an X axis direction in FIG. 1. An XYZ rectangular coordinate system is illustrated in FIG. 6 and FIG. 7.

As illustrated in FIG. 6, the ultrasonic vibration (vibration along the X axis direction) is applied to an ultrasonic bonding point 12p of the lead wire 12 from a direct contact tip portion 4t while pressing the lead wire 12 with the direct contact tip portion 4t of a bonding, tool 4 by pressing force P4 to execute the ultrasonic vibration processing.

In contrast, the press members 29 and 39 are joined to a cylinder which is not shown in the drawings. The press members 29 and 39 move in a Z axis direction in FIG. 6 (a −Z direction) by pressing force F29 and F39 from the cylinder, thereby applying pressure toward a side of a substrate table 10. In other words, the press members 29 and 39 perform the press processing of pressing press portions W29 and W39 of the lead wire 12 located at both sides of the ultrasonic bonding point 12p (application portion) by the pressing force F29 and F39 at a time of executing the ultrasonic vibration processing. The press processing suppresses a phenomenon of an occurrence of lift (deflection) of the lead wire 12.

In planar view of the lead wire 12 having a linear shape at the time of the ultrasonic vibration bonding processing described above (when seeing the lead wire 12 from an upper direction (+z side)), the press portion W29 (approximately 10 mm in width in a Y direction) pressed by the press member 29, a gap Δ29 (approximately 1 mm), the ultrasonic bonding point 12p (a width of the direct contact tip portion 4t in the Y direction), a gap Δ39 (approximately 1 mm), and the press portion W39 (approximately 10 mm in width in the Y direction) pressed by the press member 39 are located in an extension direction of the lead wire 12. In other words, the gaps Δ29 and Δ39 each having a gap distance of approximately 1 mm surely occur between an end portion of the direct contact tip portion 4t and the press members 29 and 39 located at the both sides of the direct contact tip portion 4t on the lead wire 12. When a distance of the ultrasonic bonding point 12p is set to relatively large, a gap (abbreviated as "the gap between the bonding points" hereinafter) also occurs between one press portion W29 (W39) and the other press portion W39 (W29) between one and the other ultrasonic bonding points 12p adjacent to each other.

Neither the press processing by the press members 29 and 39 nor the bonding processing by the bonding tool 4 is performed on the regions where the gaps Δ29 and Δ39 are formed (the lead wire gap formation regions) and the region where the gap between the bonding points is formed (the formation region between the bonding points) on the lead wire 12, so that as illustrated in FIG. 7, there is a possibility of an occurrence of lifts of lead wire 12u (deflection) in the lead wire gap formation regions (Δ29 and Δ39) in the lead wire 12, and there is also a possibility of an occurrence of deflection in the formation region between the bonding points.

As described above, there are surely the lead wire gap formation regions, at the time of executing the ultrasonic vibration processing, on the lead wire 12 between the press members 29 and 39 and the direct contact tip portion 4t of the bonding tool 4 also in the conventional ultrasonic vibration bonding apparatus 200 having an aspect of pressing the both sides of the ultrasonic bonding point 12p of the lead wire 12 by the press members 29 and 39, so that there is a problem that the lift of lead wire 12u cannot be reliably resolved.

The present invention therefore has been made in view of the above-mentioned problems and an object of the present invention is to provide an ultrasonic vibration bonding apparatus capable of reliably resolving a lift of lead wire and accurately bonding the lead wire onto the substrate.

Means to Solve the Problem

An ultrasonic vibration bonding apparatus according to the present invention includes: a substrate table on which a substrate is disposed; a bonding tool executing an ultrasonic vibration processing of applying ultrasonic vibration to an application portion on a lead wire having conductivity from a direct contact tip portion while applying predetermined pressure on a side of the substrate table in a state where the lead wire is disposed on the substrate; and first and second press mechanisms including first and second press rollers capable of performing a rotational operation, wherein the first and second press mechanisms execute a press processing of pressing both sides of the application portion on the lead wire by the first and second press rollers at a time of execution of the ultrasonic vibration processing by the bonding tool and a movement processing of executing a rotational operation performed by the first and second press rollers to move the first and second press rollers on the lead wire while pressing the lead wire at a time of non-execution of the ultrasonic vibration processing by the bonding tool.

Effects of the Invention

According to the ultrasonic vibration bonding apparatus in the present invention, the first and second press mechanisms executes the press processing at the time of the ultrasonic vibration processing by the bonding tool, a lift of the lead wire, that is deflection of the lead wire in the ultrasonic vibration processing, can be suppressed. However, gaps occur between the bonding tool and the first and second press rollers, so that there remains a possibility that deflection occurs in a lead wire gap formation regions under the gaps in the lead wire and the lift of the lead wire thereby occurs.

In the ultrasonic vibration bonding apparatus according to the invention of the present application, the first and second press mechanisms can press the lead wire gap formation regions by at least one of the first and second press rollers by performing a movement processing of moving on the lead wire while pressing the lead wire, thus the lift of the lead wire can be reliably resolved and the lead wire can be accurately bonded onto the substrate.

These and other objects, features, aspects and advantages of the present invention will become more apparent from the following detailed description of the present invention when taken in conjunction with the accompanying drawings.

DESCRIPTION OF EMBODIMENT(S)

The present invention is an invention relating to a pressurized ultrasonic vibration bonding apparatus for bonding a lead wire having conductivity onto a thin substrate by ultrasonic vibration bonding. A thickness of the substrate is approximately 2 mm or smaller, for example. The present invention is specifically described hereinafter based on the drawings illustrating an embodiment thereof.

Embodiment (Entire Configuration)

Figure 1:
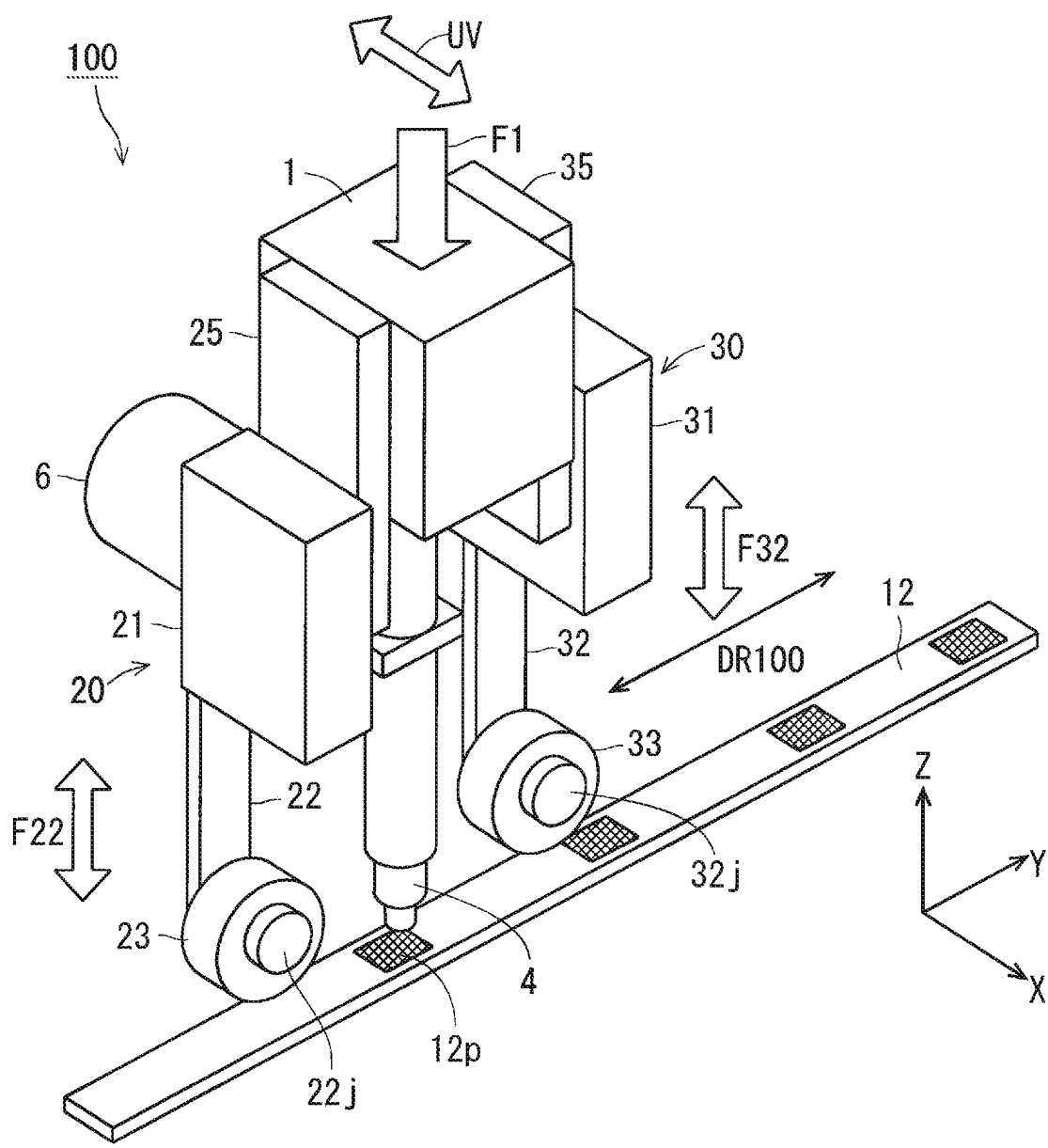
FIG. 1 An explanation drawing illustrating a configuration of a pressurized ultrasonic vibration bonding apparatus, which is an embodiment in the present invention.

FIG. 1 is an explanation drawing illustrating an entire configuration of a pressurized ultrasonic vibration bonding apparatus 100, which is the embodiment in the present invention. FIG. 1 is a perspective view of viewing the ultrasonic vibration bonding apparatus 100 obliquely from above. An XYZ rectangular coordinate system is illustrated in FIG. 1 and subsequent FIG. 2 to FIG. 4.

As illustrated in FIG. 1, the ultrasonic vibration bonding apparatus 100 includes a (electrical) cylinder 1, a bonding tool 4 having a direct contact tip portion 4t, a vibration horn unit 6, press mechanisms 20 and 30, and a substrate table 10 described hereinafter (not shown in FIG. 1).

The cylinder 1 is joined to the bonding tool 4, and drive force (pressing force) F1 of the cylinder 1 is transmitted to the bonding tool 4, thus the cylinder 1 can control the driving of the bonding tool 4. Specifically, the cylinder 1 can move the bonding tool 4 along a Z axis direction. The cylinder 1 can apply predetermined pressure to a lead wire 12 via the direct contact tip portion 4t of the bonding tool 4. Aluminum, for example, may be adopted as a constituent material of the lead wire 12.

The bonding tool 4 is supported by a holder not shown, and the bonding tool is guided in a vertical direction in the holder. The direct contact tip portion 4t is disposed on a tip portion of the bonding tool 4 on the side of the substrate table 10. The vibration horn unit 6 is connected to the bonding tool 4, and an ultrasonic vibration UV generated in an ultrasonic vibrator not shown is transmitted to the bonding tool 4 via the vibration horn unit 6.

The direct contact tip portion 4t, which is formed on a tip portion of the bonding tool 4, is a portion being in direct contact with a work (the lead wire 12) in an ultrasonic vibration bonding processing. A first concave-convex shape having predetermined pattern, for example, is formed on a surface of the direct contact tip portion 4t being in direct contact with the lead wire 12, and a plurality of second concave-convex shapes smaller than the first concave-convex shape are formed on the first concave-convex shape.

In the ultrasonic vibration bonding apparatus 100 of the present embodiment, both side surfaces (surfaces on both sides of a Y direction) of the cylinder 1 joined to the bonding tool 4 are joined to (cylinders 21 and 31) of the press mechanisms 20 and 30 via bonding plates 25 and 35, and the bonding tool 4 and the press mechanisms 20 and 30 are thereby integrally constituted.

The (electrical) cylinder 21, a press member 22, and a press roller 23 constitute the press mechanism 20 (a first press mechanism), and the press roller 23 (a first press roller) can perform a rotational operation centering around a rotational axis 22j of the press member 22. In a similar manner, a (electrical) cylinder 31, a press member 32, and a press roller 33 constitute the press mechanism 30 (a second press mechanism), and the press roller 33 (a second press roller) can perform a rotational operation centering around the rotational axis 32i of the press member 32.

The press members 22 and 32 are joined to the cylinders 21 and 31. Thus drive force (pressing force) F22 from the cylinder 21 is transmitted to the press roller 23 via the press member 22, and the press roller 23 can move in the Z axis direction (a −Z direction). The cylinder 21 can apply predetermined pressure to the lead wire 12 via the press roller 23. In the similar manner, drive force (pressing force) F32 from the cylinder 31 is transmitted to the press roller 33 via the press member 32, and the press roller 33 can move in the Z axis direction (the −Z direction), and moreover, the cylinder 31 can apply predetermined pressure to the lead wire 12 via the press roller 33.

The press rollers 23 and 33 are made up of an elastic body such as rubber, thereby preventing damage on the lead wire 12 due to the press of the lead wire 12 by the press rollers 23 and 33.

A drive unit not shown is joined to the ultrasonic vibration bonding apparatus 100 in which the bonding tool 4 and the press mechanisms 20 and 30, for example, are integrally constituted, thereby being capable of executing a movement processing of moving the ultrasonic vibration bonding apparatus 100 along an apparatus operation direction DR100.

(Glass Substrate)

Figure 2:
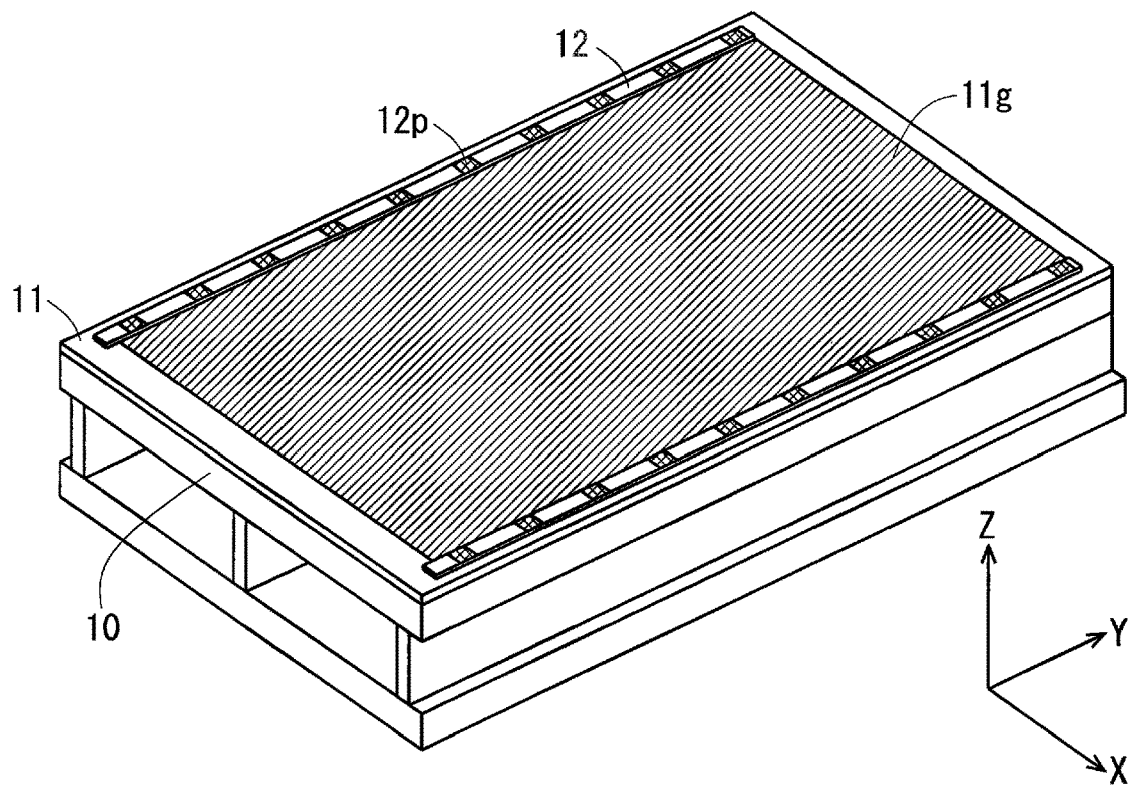
FIG. 2 A perspective view illustrating a state where a glass substrate is disposed on a substrate table and a lead wire is bonded onto the glass substrate.

FIG. 2 is a perspective view illustrating a state where a glass substrate 11 is disposed on the substrate table 10 and the lead wire 12 is bonded onto the glass substrate 11.

As illustrated in FIG. 2, the glass substrate 11 having a surface on which a solar battery thin film 11g is formed is disposed on the substrate table 10, and the lead wire 12 is provided on the solar battery thin film 11g of the glass substrate 11. Although not shown in the drawings, at least one hole is drilled in an upper surface of the substrate table 10, and the glass substrate 11 is fixed to the substrate table 10 by a vacuum contact via the hole.

In executing the ultrasonic vibration processing, the lead wire 12 having conductivity is disposed on (the solar battery thin film 11g of) the glass substrate 11. In the above state, the bonding tool 4 applies predetermined pressure, which is directed toward the side of the substrate table 10, to the lead wire 12 by the drive force F1 from the cylinder 1, and also the ultrasonic vibration UV generated in the ultrasonic vibrator and then obtained via the vibration horn unit 6 is applied from the directed contact tip portion 4t of the bonding tool 4 on, the ultrasonic bonding point 12p of the lead wire 12, thereby the ultrasonic vibration processing of bonding the lead wire 12 onto the glass substrate 11 is executed.

(Ultrasonic Vibration Bonding Operation)

Figure 3:
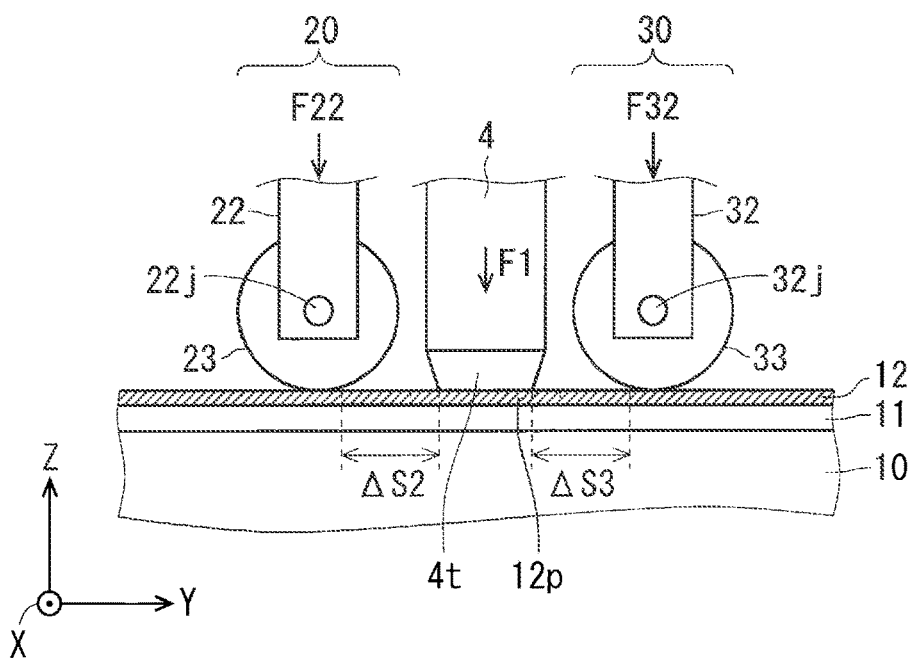
FIG. 3 A cross-sectional view schematically illustrating a state of execution of the ultrasonic vibration processing according to the ultrasonic vibration bonding apparatus of the present embodiment.
Figure 4:
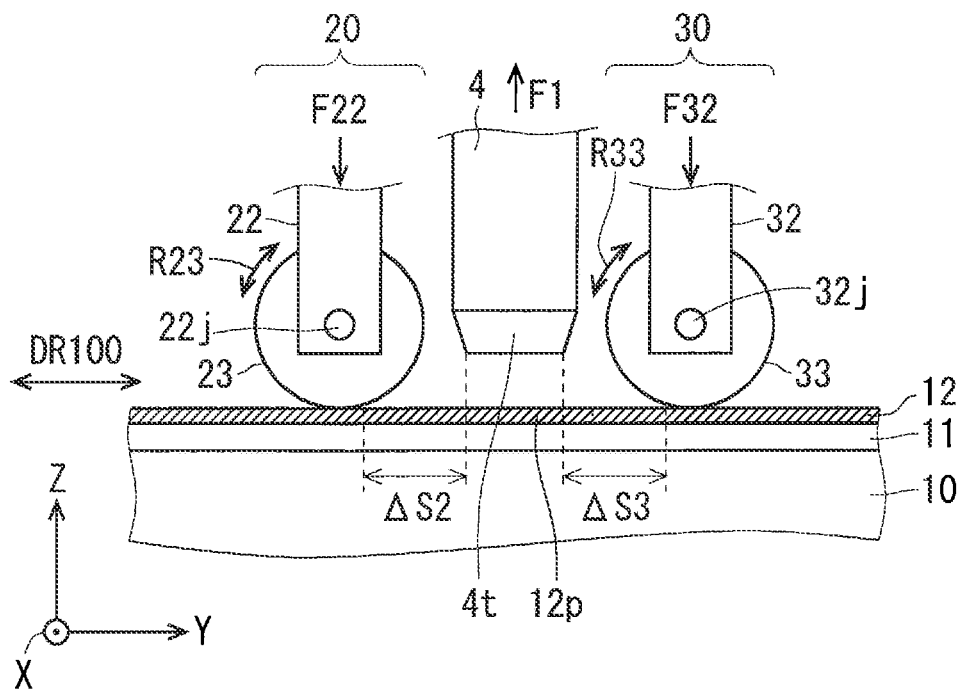
FIG. 4 A cross-sectional view schematically illustrating a state of non-execution of the ultrasonic vibration processing according to the ultrasonic vibration bonding apparatus of the present embodiment.

FIG. 3 and FIG. 4 are cross-sectional views schematically illustrating states of execution and non-execution of the ultrasonic vibration processing according to the ultrasonic vibration bonding apparatus of the present embodiment, respectively. Specifically, FIG. 3 illustrates the press processing of pressing the lead wire 12 by the press mechanisms 20 and 30, and FIG. 4 illustrates a movement processing by a rotational operation of the press rollers 23 and 33 of the press mechanisms 20 and 30. Both FIG. 3 and FIG. 4 are enlarged views of the ultrasonic vibration bonding apparatus 100 seen from a lateral direction (a side of the X direction). The illustration of the solar battery thin film 11g is omitted in FIG. 3 and FIG. 4.

Described hereinafter with reference to FIG. 1 to FIG. 4 is a pressurized ultrasonic vibration bonding operation using the ultrasonic vibration bonding apparatus 100 of the present embodiment 1.

Firstly, a thin glass substrate 11 having a surface on which the solar battery thin film 11g is formed is disposed on the substrate table 10. Then, the glass substrate 11 is fixed to the substrate table 10 by the vacuum contact via the hole (not shown) provided in the substrate table 10.

Next, the thin film lead wire 12 having conductivity is wound around a reel not shown in the drawings. The lead wire 12 is drawn from the reel, and the drawn lead wire 12 is disposed in a predetermined position on (the solar battery thin film 11g of) the glass substrate 11.

Executed next is the press processing which is performed by the press rollers 23 and 33 of the press mechanisms 20 and 30 pressing the lead wire 12 (toward the side of the substrate table 10) by the pressing force F22 and F32 of the cylinders 21 and 31. Herein, as illustrated in FIG. 3, the press rollers 23 and 33 press the lead wire 12 with the ultrasonic bonding point 12p, on which the pressurized ultrasonic vibration bonding is implemented, therebetween. That is to say, the press rollers 23 and 33 press both sides of the ultrasonic bonding point 12p, which is an application portion for applying the ultrasonic vibration UV in the lead wire 12, toward the side of the substrate table 10.

Then, in the state where the lead wire 12 is pressed by the press rollers 23 and 33, the bonding tool 4 is moved downward toward the lead wire 12 by the drive force F1 of the cylinder 1. Furthermore, when the direct contact tip portion 4t of the bonding tool 4 comes in direct contact with the lead wire 12, the predetermined pressure is applied to the lead wire 12 toward the side of the substrate table 10 by the drive force F1 of the cylinder 1.

As described above, after the lead wire 12 is pressed by the press rollers 23 and 33 in the press processing performed by the press mechanisms 20 and 30 and the bonding tool 4 applies the predetermined pressure to the lead wire 12, the ultrasonic vibrator is made to generate the ultrasonic vibration UV. The generated ultrasonic vibration UV is transmitted to the bonding tool 4 via the vibration horn unit 6. Then, the direct contact tip portion 4t of the bonding tool 4 performs the ultrasonic vibration UV having a predetermined number of vibrations (for example, 20 to 40 kHz) and a predetermined vibration amplitude (10 μm or smaller, for example, approximately 4 or 5 μm in terms of a damage prevention for the glass substrate 11).

Herein, a vibration direction of the ultrasonic vibration UV may be a direction parallel to the Y axis direction (that is to say, an extension direction of the lead wire 12) or a direction parallel to the X axis direction (that is to say, a width direction of the lead wire 12), for example. As described above, when the ultrasonic vibration processing using the bonding tool 4 is performed, the ultrasonic vibration UV is applied to the ultrasonic bonding point 12p of the lead wire 12 via the direct contact tip portion 4t.

As described above, the lead wire 12 is pressed by the press rollers 23 and 33, and also the pressurized ultrasonic vibration processing using the bonding tool 4 (the direct contact tip portion 4t) is executed on the lead wire 12, thereby the lead wire 12 is bonded to the glass substrate 11.

In planar view of the lead wire 12 having a linear shape at the time of the ultrasonic vibration bonding (when seeing the lead wire 12 from the upper direction), as illustrated in FIG. 3, the press roller 23 of the press mechanism 20, a gap ΔS2 (approximately 1 mm) between, the press roller 23 and the direct contact tip portion 4t, an ultrasonic vibration bonding executing portion (a width of the direct contact tip portion 4t in the Y direction), a gap ΔS3 (approximately 1 mm) between the direct contact tip portion 4t and the press roller 33, and the press roller 33 of the press mechanism 30 are located in an extension direction of the lead wire 12 (the Y direction).

The press processing performed by the press mechanisms 20 and 30 is executed with such a degree that the pressure applied to the lead wire 12 by the press rollers 23 and 33 does not cause damage to the thin glass substrate 11, and the pressure is set to approximately 10 kg, for example, although it depends on a material and a thickness of the glass substrate 11. The press rollers 23 and 33 of the press mechanisms 20 and 30 come in direct contact with only the lead wire 12, and do not come in contact with the glass substrate 11 (the solar battery thin film 11g) at the time of press processing.

As described above, the glass substrate 11 is bonded in the ultrasonic bonding point 12p of the lead wire 12 by the bonding tool 4 while the both sides of the ultrasonic bonding point 12p of the lead wire 12 are pressed in the press processing by the press rollers 23 and 33 of the press mechanisms 20 and 30.

The press of the lead wire 12 by the press rollers 23 and 33 leads to the press of the glass substrate 11 to the substrate table 10. Accordingly, the glass substrate 11 is fixed to the substrate table 10 more firmly, thus the glass substrate 11 is prevented from moving with respect to the substrate table 10 at the time of implementing the pressurized ultrasonic vibration bonding on the lead wire 12. As described above, when the glass substrate 11 is firmly fixed, only the lead wire 12 can be ultrasonic vibrated. That is to say, ultrasonic vibration energy by the bonding tool 4 can be effectively converted into friction energy at a contact portion between the glass substrate 11 and the lead wire 12. Accordingly, the bonding between the lead wire 12 and the glass substrate 11 by the ultrasonic vibration can be effectively performed in a shorter time.

Figure 7:
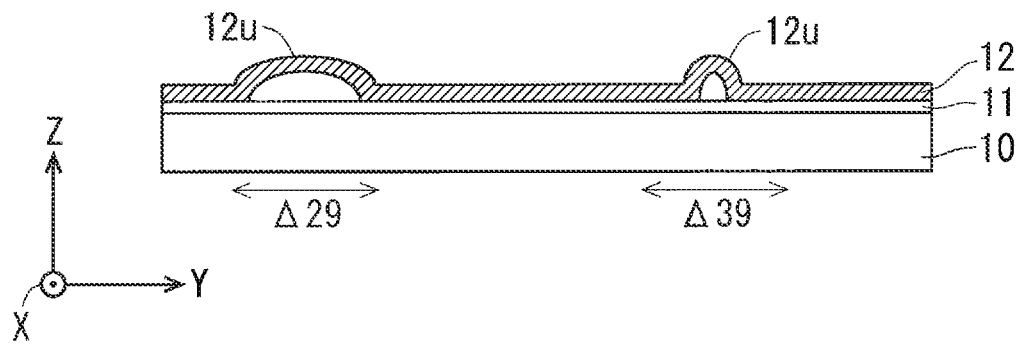
FIG. 7 An explanation drawing for pointing out a problem of e conventional ultrasonic vibration bonding apparatus.

However, the gaps ΔS2 and ΔS3 are located between the press rollers 23 and 33 and the ultrasonic bonding point 12p, so that there remains a possibility of an occurrence of lifts of lead wire (deflection) in regions where the gaps ΔS2 and ΔS3 are formed (referred to as "the lead wire gap formation regions" hereinafter) in the lead wire 12 by a reason similar to the gaps Δ29 and Δ39 illustrated in FIG. 7. When a distance of the ultrasonic bonding point 12p is set to relatively large, there is a possibility of an occurrence of a lift of lead wire 12 in the formation region between the bonding points.

Next, the ultrasonic vibration bonding apparatus 100 executes the movement processing of moving the press mechanisms 20 and 30 performed when the ultrasonic vibration processing is not executed.

As illustrated in FIG. 4, the bonding tool 4 is moved in the Z axis direction (the +Z direction) by the drive force F1 from the cylinder 1 so that the bonding tool 4 is lifted above the side of the substrate table 10. In other words, the ultrasonic vibration bonding apparatus 100 moves the bonding tool 4 in the upper direction by the drive force F1 of the cylinder 1 after executing the ultrasonic vibration processing of bonding the lead wire 12 to the glass substrate 11, thereby releasing a contact state between the bonding tool 4 and the lead wire 12.

In the meanwhile, the pressure on the lead wire 12 from the press rollers 23 and 33 of the press mechanisms 20 and 30 is set so that it does not cause damage to the thin glass substrate 11 but enables the rotational operation (rotational directions R23 and R33) by the press rollers 23 and 33 centering around the rotational axes 22j and 32j on the lead wire 12 and the movement of the pressing mechanisms 20 and 30 on the lead wire 12 together with the bonding tool 4 while pressing the lead wire 12.

Executed in the state described above is the movement processing of moving the ultrasonic vibration bonding apparatus 100 along the apparatus operation direction DR100 by the drive unit not shown joined to the ultrasonic vibration bonding apparatus 100. Also applicable is the movement processing of relatively moving the ultrasonic vibration bonding apparatus 100 along the apparatus operation direction DR100 with respect to the substrate table 10 by moving the substrate table 10 to which the glass substrate 11 is fixed by the vacuum contact along the apparatus operation direction DR100 without providing the drive unit.

That is to say, executed is the movement processing of the ultrasonic vibration bonding apparatus 100 by the rotational operation of the press rollers 23 and 33 moving on the lead wire 12 along the apparatus operation direction DR100. Then, the moving operation is stopped in a state where the direct contact tip portion 4t of the bonding tool 4 is located above the next ultrasonic bonding point 12p to which the ultrasonic vibration is applied.

As a result, one of the press rollers 23 and 33 moves while surely pressing the lead wire gap formation regions (the regions corresponding to ΔS2 and ΔS3) in the lead wire 12 during the movement processing, thus even if the lift of the lead wire occurs in the lead wire gap formation region in the lead wire 12 during the execution of the ultrasonic vibration processing described above, the lift of the lead wire can be reliably resolved by the press by one of the press rollers. In the similar manner, also in the case where the lift of the lead wire occurs in the formation region between the bonding points, the lift of the lead wire can be reliably resolved.

As described above, the press mechanisms 20 and 30 (the first and second press mechanisms) of the ultrasonic vibration bonding apparatus 100 according to the present embodiment executes the movement processing of moving the press rollers 23 and 33 on the lead wire 12 (including the lead wire gap formation region in the execution of the most recent ultrasonic vibration processing) while pressing the lead wire 12 after the execution of the ultrasonic vibration processing by the bonding tool 4.

Thus, the lead wire gap formation region and the formation region between the bonding points can be pressed by the at least one of the press rollers 23 and 33 (the first and second press rollers) in the moving processing of the ultrasonic vibration bonding apparatus 100. As a result, the configuration described above has an effect that the lift of the lead wire occurring in the lead wire 12 is reliably resolved in the movement processing of the ultrasonic vibration bonding apparatus 100, thus the lead wire 12 can be accurately bonded to the glass substrate 11.

(Controller)

Figure 5:
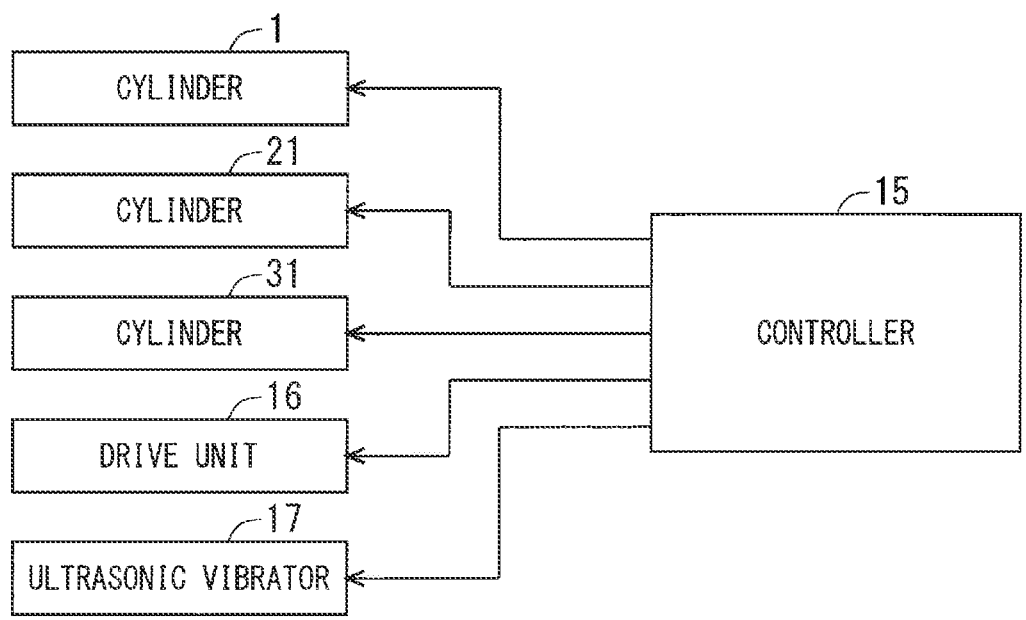
FIG. 5 A block diagram schematically illustrating a control system of the ultrasonic vibration bonding apparatus of the present embodiment.
Figure 6:
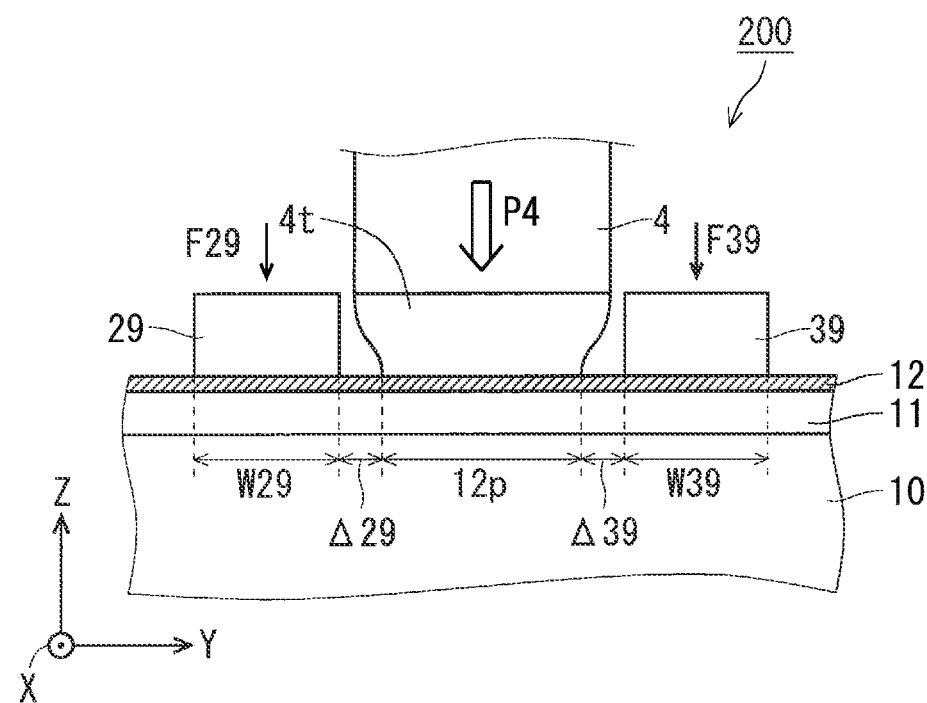
FIG. 6 An explanation drawing for pointing out a problem of a conventional ultrasonic vibration bonding apparatus.

FIG. 5 is a block diagram schematically illustrating a control system of the ultrasonic vibration bonding apparatus 100. As illustrated in FIG. 5, the ultrasonic vibration bonding apparatus 100 further includes a controller 15, and performs drive control of the cylinders 1, 21, and 31, a drive unit 16, and an ultrasonic-vibrator 17 in the controller 15. The drive unit 16 executes the movement processing of moving the whole ultrasonic vibration bonding apparatus 100 in the apparatus operation direction DR100, and the ultrasonic vibrator 17 executes the ultrasonic vibration processing of providing the bonding tool 4 with the ultrasonic vibration UV via the vibration horn unit 6.

The controller 15 can perform a variable control of the pressing force F22 and F32 of the press rollers 23 and 33 by performing the drive control of the cylinders 21 and 31, and also can control the movement processing of moving the ultrasonic vibration bonding apparatus 100 along the apparatus operation direction DR100 by controlling the drive unit 16.

Furthermore, the controller 15 can control the drive force F1 applied to the bonding tool 4 along the Z axis direction by performing the drive control of the cylinder 1, and can control the ultrasonic vibration processing of the bonding tool 4 by controlling the ultrasonic vibrator 17. Accordingly, the controller 15 can variably control conditions (a total number of vibrations, vibration amplitude, and pressurizing force) of the ultrasonic vibration bonding processing performed by the bonding tool 4 in accordance with an instruction from a user, for example.

In the meanwhile, the pressing force on the glass substrate 11 by the press mechanisms 20 and 30 needs to be changed in accordance with a material and a thickness of the glass substrate 11, a material and a thickness of the solar battery thin film 11g, and conditions of the ultrasonic vibration bonding processing. The controller 15 therefore variably controls the pressing force F22 and F32 by the press mechanisms 20 and 30 via the cylinders 21 and 31 in accordance with the instruction from the user. Specifically, when each information (a material and a thickness of the glass substrate 11 itself and each film constituting the solar battery thin film 11g and conditions of the ultrasonic vibration bonding processing, for example) is input to the controller 15, the pressing force F22 and F32 of the press mechanisms 20 and 30 can be controlled by the pressing force determined from a preset information table and each information described above. Herein, the pressing force is unambiguously defined for each information described above in the information table.

As described above, the pressing force F22 and F32 of the press rollers 23 and 33 can be appropriately controlled in accordance with the conditions of the ultrasonic vibration bonding processing during and after the execution of the ultrasonic vibration processing by driving the cylinders 21 and 31 of the press mechanisms 20 and 30 under control of the controller 15.

As described above, the pressing force F22 and F32 by the press mechanisms 20 and 30 and the conditions of the ultrasonic vibration bonding processing performed by the bonding tool 4, for example, can be variably controlled under the control of the controller 15. Accordingly, the pressing force F22 and F32 by the press mechanisms 20 and 30, drive contents of the drive unit 16, and the conditions of the ultrasonic vibration bonding processing performed by the bonding tool 4 (the cylinder 1 and the ultrasonic vibrator 17) can be appropriately changed in accordance with the thickness and the material of the glass material 11 and the solar battery thin film 11g, for example.

As a result, the ultrasonic vibration bonding apparatus 100 of the present embodiment can reliably resolve the possibility of the occurrence of the lift of the lead wire in the lead wire 12 without affecting the glass substrate 11 (including the solar battery thin film 11g) and also can appropriately change the pressing force F22 and F32, the drive contents of the drive unit 16, and the conditions of the ultrasonic vibration bonding processing so as to bond the lead wire 12 onto the glass substrate 11.

The effect described above can be obtained when the controller 15 controls at least the pressing force F22 and F32 by the press mechanisms 20 and 30.

(Other)

In the embodiment described above, the glass substrate 11 is described as the substrate on which the lead wire 12 is formed, however, the substrate may be made up of a thin member such as ceramic, silicon, and epoxy instead of the glass substrate 11. Aluminum is described as the constituent material of the lead wire 12 having conductivity, however, the other material having conductivity may be adopted as the constituent material.

The ultrasonic vibration bonding apparatus 100 having the configuration that the bonding tool 4 and the press mechanisms 20 and 30 are integrally formed is described, however, the bonding tool 4 and the press mechanisms 20 and 30 may be separated from each other to constitute the ultrasonic vibration bonding apparatus. In the above case, the bonding tool 4 and the press mechanisms 20 and 30 perform the movement processing independently from each other. The electrical cylinder is described as the cylinders 1, 21, and 31, however, the configuration of the ultrasonic vibration bonding apparatus 100 of the present embodiment is not limited thereto.

The present invention has been shown and described in detail, the foregoing description is in all aspects illustrative and not restrictive. It is therefore understood that numerous modifications and variations can be devised without departing from the scope of the invention.

The invention claimed is:
1. An ultrasonic vibration bonding apparatus, comprising:
a substrate table on which a substrate is disposed;
a bonding tool executing an ultrasonic vibration processing of applying ultrasonic vibration to an application portion on a lead wire having conductivity from a direct contact tip portion while applying predetermined pressure on a side of the substrate table in a state where the lead wire is disposed on the substrate; and
first and second press mechanisms including first and second press rollers capable of performing a rotational operation, wherein
the first and second press mechanisms execute
a press processing of pressing both sides of the application portion on the lead wire by the first and second press rollers at a time of execution of the ultrasonic vibration processing by the bonding tool, and
a movement processing of executing a rotational operation performed by the first and second press rollers to move the first and second press rollers on the lead wire while pressing the lead wire at a time of non-execution of the ultrasonic vibration processing by the bonding tool,
the bonding tool and the first and second press mechanisms are physically connected,
a contact state between the bonding tool and the lead wire is released during the execution of the movement processing,
an extension direction of the lead wire is a predetermined direction,
the bonding tool and the first and second press rollers are disposed along the predetermined direction, and
the first and second press rollers are moved along the predetermined direction during the execution of the movement processing.
2. The ultrasonic vibration bonding apparatus according to claim 1, further comprising
a controller controlling the first and second press mechanisms, wherein
the controller variably controls pressing force by the first and second press rollers.

\* \* \* \* \*